(12) United States Patent
Melz et al.

(10) Patent No.: US 9,899,592 B2
(45) Date of Patent: Feb. 20, 2018

(54) ACTUATING DRIVE AND METHOD FOR COOLING A SOLID BODY ACTUATOR HOUSED IN AN ACTUATING DRIVE WITH AN ACTUATING ELEMENT

(71) Applicant: Fraunhofer-Gesellschaft zur Foerderung der angewandten Forschung e.V., Munich (DE)

(72) Inventors: Tobias Melz, Darmstadt (DE); Michael Matthias, Weiterstadt (DE); Holger Hanselka, Darmstadt (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 404 days.

(21) Appl. No.: 14/417,624

(22) PCT Filed: Jul. 23, 2013

(86) PCT No.: PCT/EP2013/002192
§ 371 (c)(1),
(2) Date: Jan. 27, 2015

(87) PCT Pub. No.: WO2014/015979
PCT Pub. Date: Jan. 30, 2014

(65) Prior Publication Data
US 2015/0221854 A1 Aug. 6, 2015

(30) Foreign Application Priority Data
Jul. 27, 2012 (DE) .................. 10 2012 014 892

(51) Int. Cl.
*H01L 41/053* (2006.01)
*H01L 41/083* (2006.01)
(Continued)

(52) U.S. Cl.
CPC ........ *H01L 41/0906* (2013.01); *H01L 41/053* (2013.01); *H01L 41/0536* (2013.01);
(Continued)

(58) Field of Classification Search
CPC ............... H01L 41/0096; H01L 41/053; H01L 41/0536; H01L 41/06; H01L 41/0835; H01L 41/12
(Continued)

(56) References Cited

U.S. PATENT DOCUMENTS 2,030,912 A * 2/1936 Dickinson ................. B66B 3/00
187/380
3,694,675 A * 9/1972 Loveday ............... B06B 1/0618
310/26
(Continued)

FOREIGN PATENT DOCUMENTS

EP 1705722 A2 9/2006
GB 2328342 A 2/1999
(Continued)

*Primary Examiner* — Thomas Dougherty
(74) *Attorney, Agent, or Firm* — Fitch, Even, Tabin & Flannery LLP

(57) ABSTRACT

The invention is an actuating drive for deflecting an actuating element using a solid body actuator (2) when an electrical voltage or an alternating magnetic field is applied, to cause a change in length. A housing (1) encloses the solid body actuator to define an interspace (13) in a fluid-tight manner. Furthermore, the solid body actuator includes a hollow duct (6) having one end connected to a first hollow conduit (20) passing through the housing and the other end opening into the interspace (13). The interspace is additionally connected in a fluid-tight manner to a second hollow conduit (21) passing through the housing.

19 Claims, 5 Drawing Sheets

Figure 1:
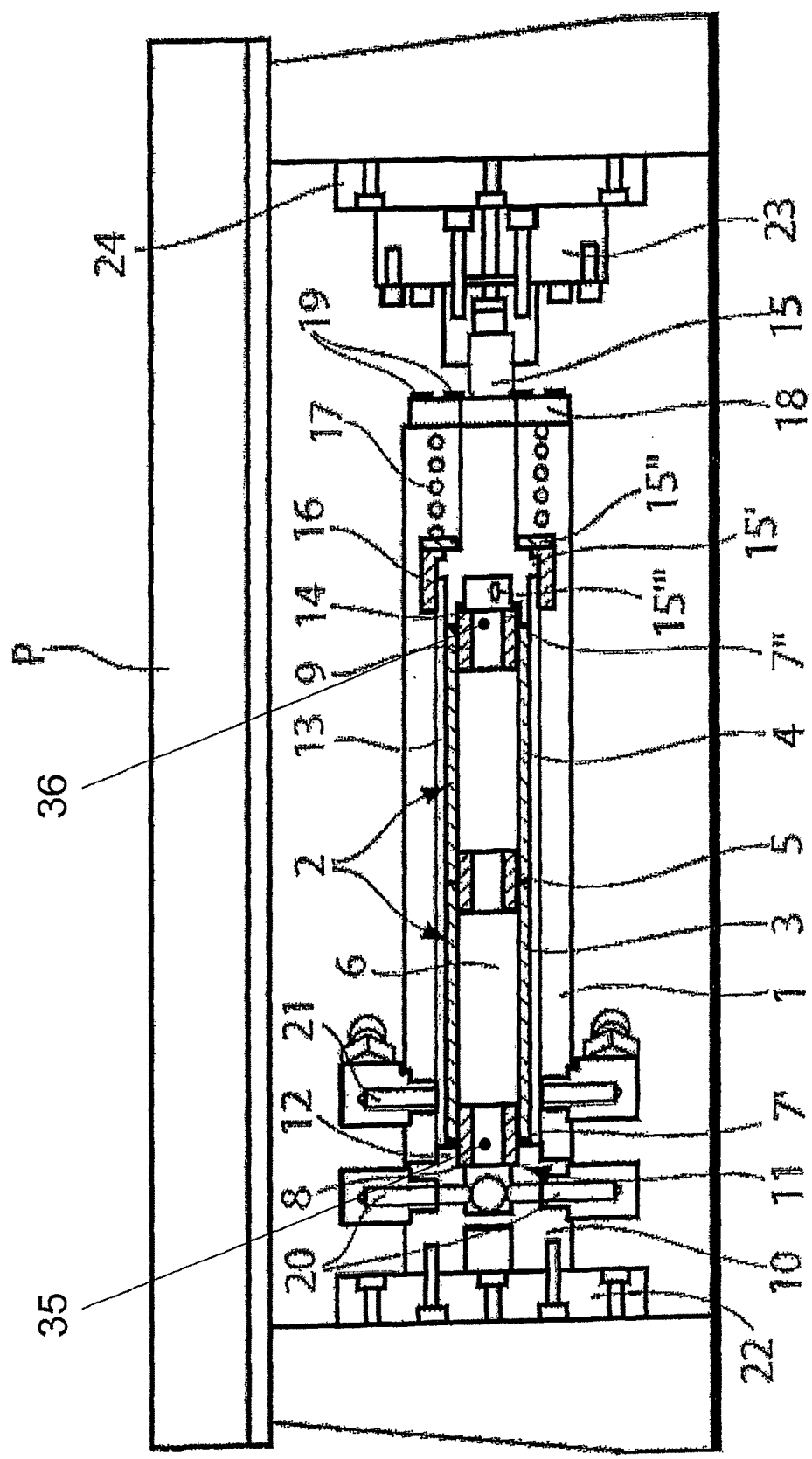

(51) Int. Cl.
*H01L 41/09* (2006.01)
*H01L 41/12* (2006.01)
*H01L 41/06* (2006.01)

(52) U.S. Cl.
CPC .......... *H01L 41/06* (2013.01); *H01L 41/0835* (2013.01); *H01L 41/12* (2013.01)

(58) Field of Classification Search
USPC .................................. 310/26, 311–371, 800
See application file for complete search history.

(56) References Cited

U.S. PATENT DOCUMENTS

| | | | | |
|---|---|---|---|---|
| 4,553,059 A * | 11/1985 | Abe | ........................ | F02M 51/04 310/328 |
| 4,688,945 A * | 8/1987 | Brazelton | ............. | B01F 5/0057 366/156.1 |
| 5,168,189 A * | 12/1992 | Dam | ................... | H01L 41/0471 310/328 |
| 5,501,596 A * | 3/1996 | Bailey | .................... | A61C 17/20 433/119 |
| 5,955,823 A | 9/1999 | Nilsson et al. | | |
| 5,986,449 A * | 11/1999 | Koski | ................. | G01F 23/2963 324/207.13 |
| 6,079,636 A | 6/2000 | Rembold et al. | | |
| 6,137,209 A * | 10/2000 | Nilsson | .................. | A61B 8/546 310/344 |
| 8,004,158 B2 | 8/2011 | Hielscher | | |
| 2015/0221854 A1* | 8/2015 | Melz | ..................... | H01L 41/053 310/328 |
| 2015/0320295 A1* | 11/2015 | Belson | .................. | A61B 34/30 600/141 |

FOREIGN PATENT DOCUMENTS

| | | |
|---|---|---|
| JP | 60-19968 A | 2/1985 |
| JP | 7-131085 A | 5/1995 |
| WO | 98/52274 A1 | 11/1998 |

\* cited by examiner

ACTUATING DRIVE AND METHOD FOR COOLING A SOLID BODY ACTUATOR HOUSED IN AN ACTUATING DRIVE WITH AN ACTUATING ELEMENT

CROSS REFERENCE TO RELATED APPLICATIONS

Reference is made to German Patent Application No. DE10 2010014 892.5, filed on Jul. 27, 2013 and PCT/EP2013/002192, filed Jul. 23, 2014, which applications are incorporated herein by reference in their entirety.

BACKGROUND OF THE INVENTION

Field of the Invention

The invention relates to an actuating drive for uniaxial, bi-directional deflection of an actuating element, which can be actuated directly or indirectly by a solid body actuator, which has at least one solid body actuator end braced on a frontal face in a housing that undergoes a change in length in a longitudinal extension that is assignable to the solid body actuator in response to a change in an electrical voltage that may be applied to the solid body actuator or a magnetic field acting on the solid body actuator, depending on the actuator type, and which may be transferred directly or indirectly to the actuating element via a second frontal face opposite the first frontal face in the longitudinal extension of the solid body actuator, displacing the actuating element and method for removing heat from a solid body actuator housed in an actuating drive with an actuating element.

Description of the Prior Art

Actuating drives in which solid body actuators—preferably based on piezoelectric or magnetostrictive materials which are integrated for the purpose of travel deflection, are prone to heating particularly during dynamic power operation due to the hysteresis inherent in the transducer material and the enclosure of the solid body actuator required by the system. If no measures are implemented to cool the solid body actuator, not only is there a danger that the solid body actuator may lose geometric dimensional stability due to thermal expansion of the material, but if the material-specific Curie temperature is exceeded, the energy transducing properties acquired by the material are lost. Moreover, operationally induced self-heating of the solid body actuator results mostly in an increased electrical power requirement, which has a very detrimental effect on the activation of the solid body actuator.

Heat dissipation is typically assured with an elastomer-like medium, most often cast with additional heat dissipating particles around the solid body actuator inside the actuating drive housing. Accordingly, the most prevalent cooling principle employed is to dissipate the heat from the solid body surface to the surrounding housing via the elastomeric medium.

The activation of control valves or injection valves in motor vehicles represents a typical application of an actuating drive equipped for example with a piezoelectric actuator. Such a piezoelectric actuator is described in DE 199 14 411 A1 and has a multilayer laminate of stacked layers of piezoelectric material with interposed metal or electrically conductive, layers functioning as electrodes. The actuator body, also known as a stack actuator, is integrated inside a hollow cylindrical travel path housing and one side of the body rests on a baseplate fixed inside the housing. The opposite end of the stack actuator is in contact with a valve stem, for the purpose of deflecting it in the lengthwise direction of the stack actuator. Also resting on the opposite end of the stack actuator inside the actuator housing is a spring that generates a restoring force. For purposes of cooling the stack actuator, an electrically insulating elastomer sleeve is provided which fits tightly against the inner wall of the hollow cylindrical actuating drive housing and against the stack actuator.

A similar fuel injector having a piezoelectric element is disclosed in DE11 2009 001 571 T5, in which a piezoelectric element is introduced into an injector housing, so that a cavity is delimited between the housing and the piezoelectric element. The cavity is at least partially filled with a thermally conductive material to transfer heat from the piezoelectric element to the housing.

German Patent No. DE 103 28 373 A1 discloses a piezoelectric assembly having an integrated temperature control device that is made from a composite material having an elastomeric polymer and serves as a support matrix for carbon fibers, which are preferably used in the form of carbon nanotubes for particularly effective cooling of the piezoelectric device.

The object of German Patent No. DE 10 2004 050 880 B4 discloses a fuel injector having an encased actuator, wherein the surface of the enclosure facing away from the actuator has microstructures that increase the surface arear thereof for improved heat dissipation.

Similar actuating drives, each equipped with piezoelectric actuators that provide electrically activatable cooling elements in the form of Peltier elements for actively cooling the piezoelectric actuator are also disclosed in DE 10 2009 026 533 A1 and DE 198 26 339 A1.

Japanese Patent JP 07131085 A describes a piezoelectric actuator having an actuator stack composed of a plurality of individual piezoelectric perforated discs, in which a double-tube like cooling structure is created in the interior hollow duct for cooling purposes.

JP 7094797 A discloses a piezoelectric actuator stack composed of a plurality of individual piezoelectric perforated disks, having an interior cavity and also encloses an interspace with a housing that surrounds the piezoelectric actuator stack. For cooling purposes, a coolant is circulated through the inner cavity in a closed cooling circuit and through the radially outer interspace of the actuator. The circulation of the coolant is controlled by valves which are alternately opened and closed.

SUMMARY OF THE INVENTION

The invention is an actuating drive for uniaxial, bi-directional deflection of an actuating element, which can be actuated directly or indirectly by a solid body actuator. At least one end of the solid body actuator is braced on a frontal face in a housing that undergoes at least a change in length in a longitudinal extension of the solid body actuator in response to a change in an electrical voltage that may be applied to the solid body actuator or a magnetic field acting on the solid body actuator, which longitudinal extension may be transferred directly or indirectly to the actuating element via a second frontal face opposite the first frontal face of the longitudinal extension of the solid body actuator. The actuating element is displaced, in such manner that operational heating of the solid body actuator is counteracted, particularly in a dynamic operating mode, by more effective heat dissipation than is the case with the previously known cooling measures. In particular, measures for cooling the solid body actuator, should neither impede nor limit scope of application of the actuator, and furthermore should be representable with the simplest, most inexpensive design engineering interventions possible.

According to the invention, an actuating drive is configured such that the housing at least partly surrounds the solid body actuator and serves together with the solid body actuator to delimit at least one interspace in a fluid-tight manner. The solid body actuator also has a hollow duct that passes through the solid body actuator at least in sections, and preferably completely. One end of the hollow duct is connected to a first hollow conduit that passes through the housing. The other end of the hollow duct that at least partially protrudes through the solid body actuator hollow duct opens directly or indirectly into the at least one interspace that is delimited in fluid-tight manner by the solid body actuator and the housing. In addition, the at least one interspace is connected in fluid-tight manner with a second hollow duct that passes through the housing.

The cooling according to the invention cools the solid body actuator which heats up in normal operation by using the thermal coupling of a gas-phase or liquid coolant to the immediate surface of the solid body actuator enclosed inside the actuating drive. To ensure effective cooling, the at least one solid body actuator provides at least one inner hollow duct through which the coolant is supplied via a suitable supply line. The coolant thus initially flows through the inner hollow duct of the solid body actuator, and undergoes effective heat extraction from the inside. After passing through the hollow duct, the coolant is diverted suitably so that it comes into thermal contact with the outer solid body actuator surface in the opposite overflow direction compared to the throughflow direction along the inner hollow duct. In this step, the solid body actuator undergoes heat extraction from the outside. After the coolant has preferably flowed over the entire outer surface of the solid body actuator, it is transported away from the actuator and also out of the actuating drive via a corresponding drain arrangement. Of course, it is possible to charge the actuating drive with the cooling in a reverse flow direction, that is, to cool the outer side of the solid body actuator before the coolant is passed through the at least one inner hollow duct and then transported away.

Appropriate coolants may be selected from gas-phase and liquid substances depending on the structural design of the actuating drive, and also on the intended use and purpose thereof. In an advantageous variation of the cooling according to the invention for solid body actuators integrated in actuating drives, the cooling medium transported away from the solid body actuator, which itself undergoes warming as a result of thermal coupling due to the extraction of heat from the solid body actuator, undergoes a cooling process that is external, that is spatially separate from actuating drive, and after corresponding cooling is returned to the solid body actuator in a closed circuit. In this way, loss of coolant is avoided.

The cooling according to the invention is usable for all solid body actuators fitted inside an actuating drives, and so preferably for solid body actuators made from piezoelectric or magnetostrictive material. For the purposes of explaining the cooling concept according to the invention, in the following reference is made to an actuating drive equipped with a piezoelectric actuator, which however is not limiting of the general concept for cooling a solid body actuator integrated in an actuating drive.

BRIEF DESCRIPTION OF THE INVENTION

Figure 3A:
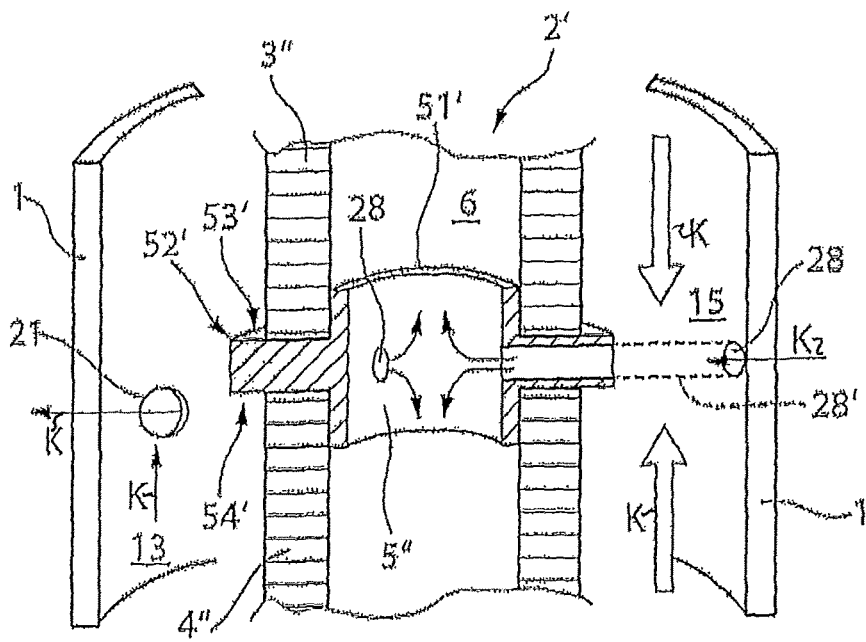
Figure 3A:
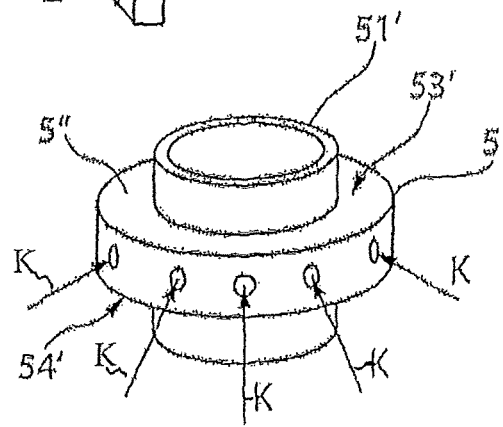
Figure 3B:
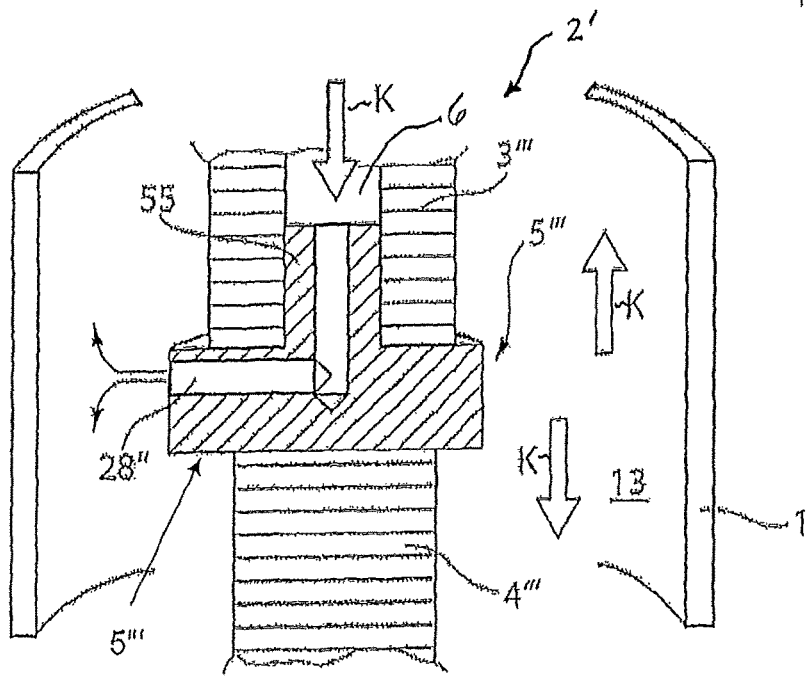
Figure 3C:
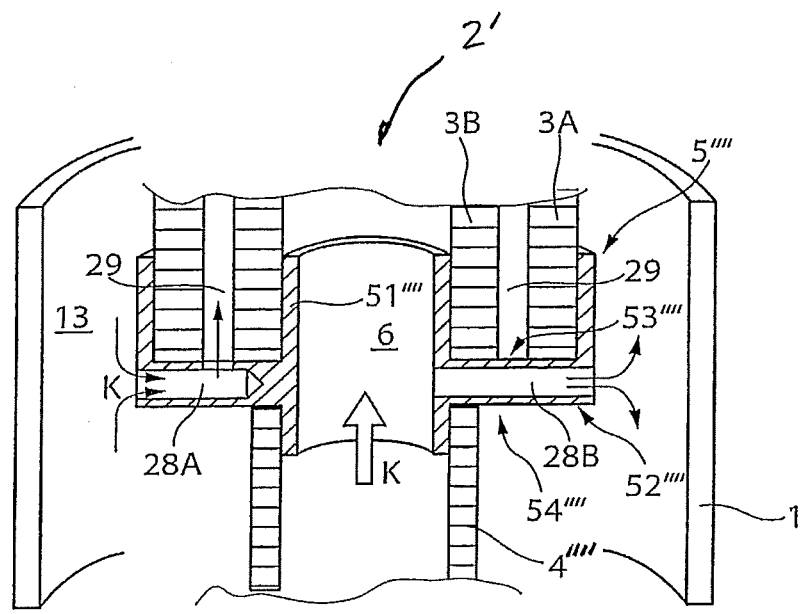
Figure 3D:
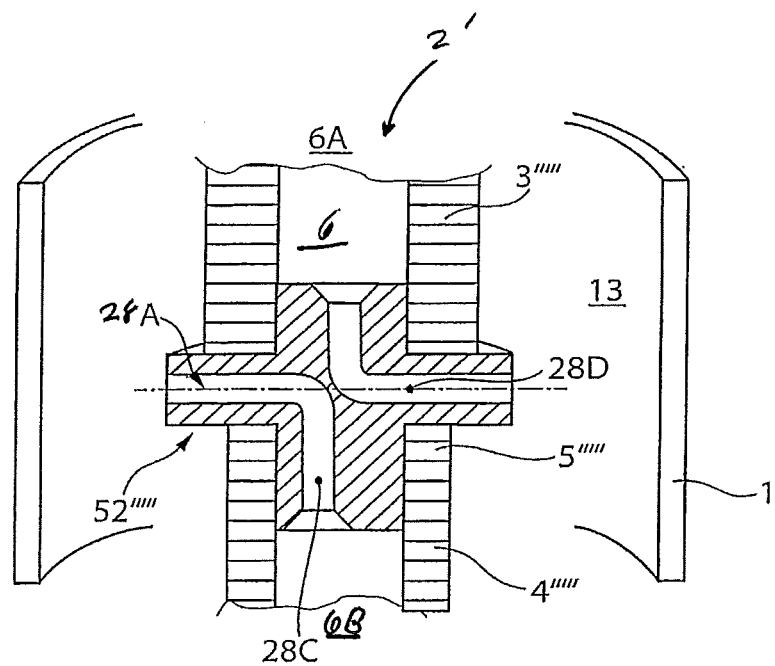
Figure 4:
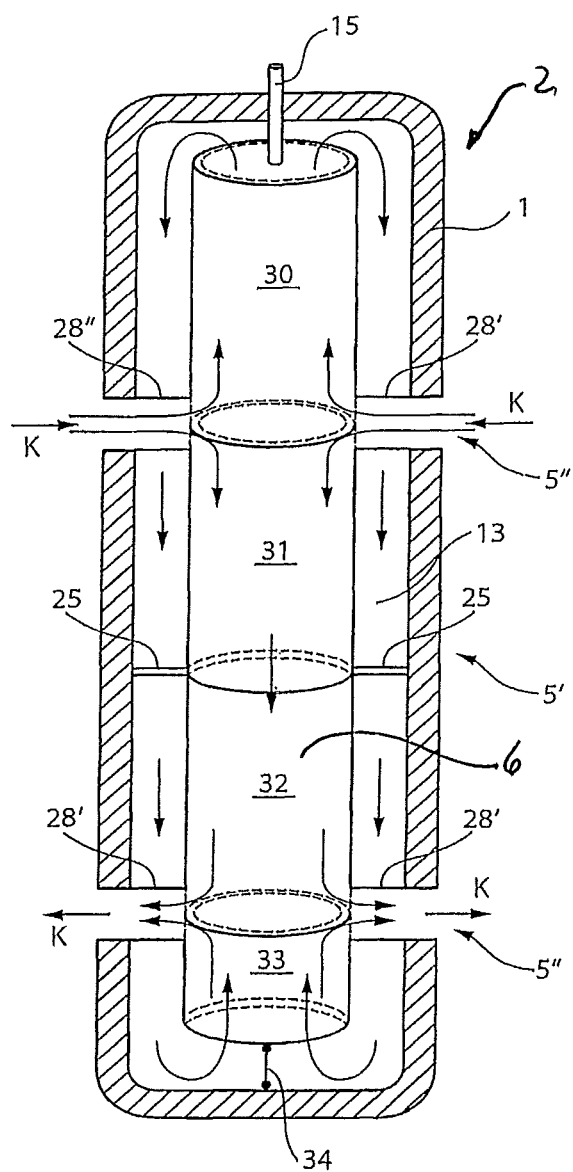

The invention will be described in the following without limitation of the general inventive thought on the basis of an exemplary embodiment thereof and with reference to the drawing. In the drawing:

FIG. 1 is a longitudinal section through an actuating drive with a cooling concept according to the invention;

FIGS. 2 *a* and *b* show a cross section and a longitudinal section through a connecting element for connecting two actuator elements inside the actuating drive;

FIGS. 3 *a-d* are cross sectional views of further variants for the formation of connecting elements; and FIG. 4 is a longitudinal section through a highly schematic actuating drive having four hollow cylindrical actuator elements connected axially in series

DETAILED DESCRIPTION OF THE INVENTION

FIG. 1 shows a longitudinal section through an actuating drive configured according to the invention, which provides a solid body actuator 2 made from piezoelectric material inside a housing 1. The actuator 2 is constructed in the embodiment shown from two hollow cylindrical piezoelectric solid body elements 3 and 4. The hollow cylindrical piezoelectric solid body elements 3 and 4 are joined by a connecting element 5, preferably made of plastic and in the form of a sleeve, to form a unitary hollow cylindrical body enclosing a hollow inner duct 6 and to join solid body elements 3 and 4 together.

The individual piezoelectric solid body elements 3 and 4 are each shaped from a monolithic piezoelectric material into a hollow cylinder, and electrodes are attached to both hollow cylindrical end faces thereof, via which an electrical voltage is applied to cause a controlled longitudinal expansion of piezoelectric solid body elements 3 and 4. Alternatively, it is also possible to combine the individual, hollow cylindrical piezoelectric elements 3 and 4 from a plurality of individual piezoelectric elements constructed from layers or perforated discs to create an actuator stack, wherein the individual layered or disc-like piezoelectric elements are tuned to each other by a comb-like electrode structure and charged with electrical voltage to activate the actuators.

Through the serial, coaxial coupling of the two individual piezoelectric elements 3 and 4 to create a solid body actuator 2 with the form of a hollow cylinder, appropriate electrical activation additively superposes the deflection travel paths in both individual piezoelectric elements 3 and 4. Of course, it is possible to combine additional hollow cylindrical piezoelectric elements with each other using suitably designed connecting elements 5, thereby increasing the total deflection travel path of solid body actuator 2 such as in FIG. 4 where hollow actuators 30-33 are joined together to form a hollow cylinder.

Connecting piece 5 is a cylinder or a sleeve of plastic that serves to connect the two piezoelectric elements 3 and 4 into the hollow cylinder and has an outer sleeve diameter equal to the inner diameter of each of hollow cylindrical piezoelectric elements 3 and 4. In order to connect both hollow cylindrical piezoelectric elements 3 and 4, the end faces of the two elements are abutted flush with one another, wherein the two piezoelectric elements 3 and 4 are joined permanently by sticking them to the inner wall of the sleeve connecting element 5 with an adhesive. In this way, it is ensured that the axial positioning forces acting between the two piezoelectric elements 3 and 4 arising from the controllably producible longitudinal changes in dimension of the two piezoelectric elements 3 and 4 are transmitted without loss from one element to the other.

The solid body actuator 2 produced as described in the preceding from two individual hollow cylindrical piezoelectric elements 3 and 4 thus has a first frontal face 7' and a second frontal face 7'' opposite thereto. Both frontal ends 7' and 7'' of solid body actuator 2 are also attached to sleeve elements 8 and 9, which are permanently adhesively attached to the inner wall of the hollow cylinder of solid body actuator 2 and project radially beyond solid body actuator 2 to the outside. As will be explained in the subsequent description, the portions of sleeve elements 8 and 9 that protrude beyond frontal ends 7' and 7'' of solid body actuator 2 serve to enable precise centering of the solid body actuator 2 inside housing 1. Thus, the portion of sleeve element 8 that protrudes beyond first frontal end 7' of solid body actuator 2 fits snugly and in a fluid-tight manner in a recess 11 created in a valve block 10, by which the solid body actuator 2 is joined in a fixed manner relative to valve block 10. In turn, valve block 10 engages in the frontal face end of hollow cylindrical housing 1 by an extension 12 that matches the inner cross section of housing 1, and connects the housing to valve block 10 in fluid-tight manner.

The dimensions of the outer diameter of cylindrical solid body actuator 2 and the inner diameter of the hollow cylindrical housing 1 that surround the solid body actuator 2 are matched with each other so that an interspace 13 is formed between the inner wall of housing 1 and the cylindrical outer surface of solid body actuator 2. The interspace 13 extends over the entire length of solid body actuator 2, which is centered inside housing 1 by the second frontal face 7'' thereof and is a hollow conduit permitting coolant to flow in contact with an outer surface of the actuators 3 and 4 to provide cooling. To this end, the portion of sleeve member 9 that protrudes beyond second frontal face 7'' engages in a corresponding stepped recess 14 of an axially movably mounted actuating element 15. Actuating element 15 is in turn centered relative to housing 1 via a centering element 16, on the radially inwardly facing sliding contact surface of which, actuating element 15 is in axial sliding contact with an annular extension 15'. The radially outer side of centering element 16 is fixed to the inner contour of housing 1 by a press fitting, so that the connection between centering element 16 and housing 1 is sealed to be fluid-tight. In the same way, the sliding contact also forms a fluid-tight join between annular projection 15' of the actuating element 15 and the inner wall of centering element 16.

In order to exert a mechanical bias on solid body actuator 2, which is essential particularly for the actuator compression after the actuator has undergone linear expansion, a spring element 17 is provided that radially partially encloses the part of actuating element 15 that projects beyond housing 1 and is located axially adjacent one side of a mounting plate 18, which is preferably connected to the right frontal face of housing 1 against the spring force of spring element 17 via fasteners 19 that preferably are screw connectors. Spring element 17 is supported by the side of the spring opposite mounting plate 18 directly on an annular shoulder 15'' on actuator 15, and thus drives the actuating element 15 by the application of the spring force axially towards the solid body actuator 2 that is mounted in centred fashion inside housing 1.

When the solid body actuator 2 is activated by current from an electric voltage source, the solid body actuator 2 expands against the spring force of spring element 17 and moves actuating element 15 axially, to the right that is, the solid body actuator 15 expands longitudinally and is deflected to the right. In the absence of electrical voltage, spring element 17 biases the solid body actuator 2 to its smallest longitudinal dimension. The actuating driver is capable of highly dynamic actuator deflections, such as are used particularly when conducting tests on samples. However, such highly dynamic processes cause substantial heating of solid body actuator 2, and the actuator therefore requires effective cooling with the aid of the illustrated construction according to the invention in which inner and outer radial surfaces of the elements 3 and 4 are contacting with coolant.

In order to actively cool the solid body actuator, a first hollow conduit 20 is provided in valve block 10 which is connected in a fluid-tight manner to hollow duct 6, which passes completely through solid body actuator 2 and in regions has openings 35 and 36 connected to a first conduit hollow conduit 20. Another hollow conduit 21 which opens into at least one interspace 13. In the embodiment shown, two conduit feeds 20 and 21 are created in valve block 10 which engage the hollow duct 6 of solid body actuator 2 through sleeve element 8.

In the area of the second frontal face 7'', hollow duct 6 is in fluid communication with interspace 13 defined radially by solid body actuator 2 and housing 1. For this purpose, at least one radially fitted passthrough opening 15''' is provided in the region of actuating element 15, and is disposed inside a blind hole recess in actuating element 15. The blind-hole recess formed inside actuating element 15 is connected in fluid-tight manner to hollow duct 6 via the sleeve-like element 9. Finally, interspace 13 is connected via at least one second hollow conduit 21 to housing 1 in the area of the first frontal face 6 of solid body actuator 2.

For cooling the actuator, liquid or gas-phase coolant is passed through first hollow conduit 20 and into hollow duct 6 of solid body actuator 2, so that in the case illustrated the coolant flows from left to right through opening 35 and out of opening 36 of the hollow duct 6. The coolant enters interspace 13 via pass through connection opening 15'''. The coolant in the interspace 13 flows over the outer surface of solid body actuator 2 in the opposite flow direction from right to left, and so is able to cool the outer surface of the elements 3 and 4. Finally, the coolant flows to the outside through second hollow duct 21.

It is possible to cause the coolant to flow in the reverse flow direction through the actuating drive for cooling purposes, during which the coolant is introduced via second hollow conduit 21 to cause the coolant first to flows through interspace 13 to cool the outside of solid body actuator 2. Then, the coolant passes through the at least one connection opening 15$w$ and into hollow duct 6 of solid body actuator 2, and finally escapes to the outside through first hollow conduit 20.

Suitable conduit pressure, propels the coolant through the corresponding hollow conduits inside the actuating drive which is provided by a feed pump, (not shown) which is connected to a coolant reservoir (also not shown).

To avoid unnecessary loss of coolant, it is advisable to cool the coolant after it exits the actuating drive, by feeding it to a corresponding cooling unit, which is connected in a closed circuit with a coolant reservoir, from which the supply of coolant to the actuating drive is assured.

The actuating drive as shown is mounted in a test frame P. For this purpose, the actuating drive is mounted permanently on a correspondingly constructed mounting plate 22 via valve block 10. The protruding area of actuating element 15 opens axially into a load cell 23, which in turn is also mounted on test frame P via a mounting plate 24.

As previously noted, the serial coaxial connection of two piezoelectric elements 3 and 4 form a unitary solid body actuator 2 in the form of an elongated hollow cylinder. It is helpful and required to join the two elements 3 and 4 to each other permanently with a cylindrical or sleeve connection in the area where the end faces thereof are closest to each other at the end faces of the elements 3 and 4. In this context, the end faces of both piezoelectric elements 3 and 4 come into direct contact, while inner wall areas of both elements close to the end faces are attached to each other permanently by means an adhesive applied to the sleeve connection member.

In order to increase the size of the solid body actuator 2 longitudinally, and to create longer travel paths and/or greater displacement forces, two or more hollow cylindrically shaped single actuators may be combined. The actuators may be piezoelectric or magnetostrictive hollow cylindrical elements or formed from actuator stacks, with each actuator stack being is constructed from a plurality of individual, layered or disc-like piezoelectric or magnetostrictive components. However, this requires a connection element that ensures optimized, mutual stable support and an exact centring of the axially assembled actuator elements not only relative to each other but also with regard to the housing surrounding the entire solid body actuator.

Figure 2A:
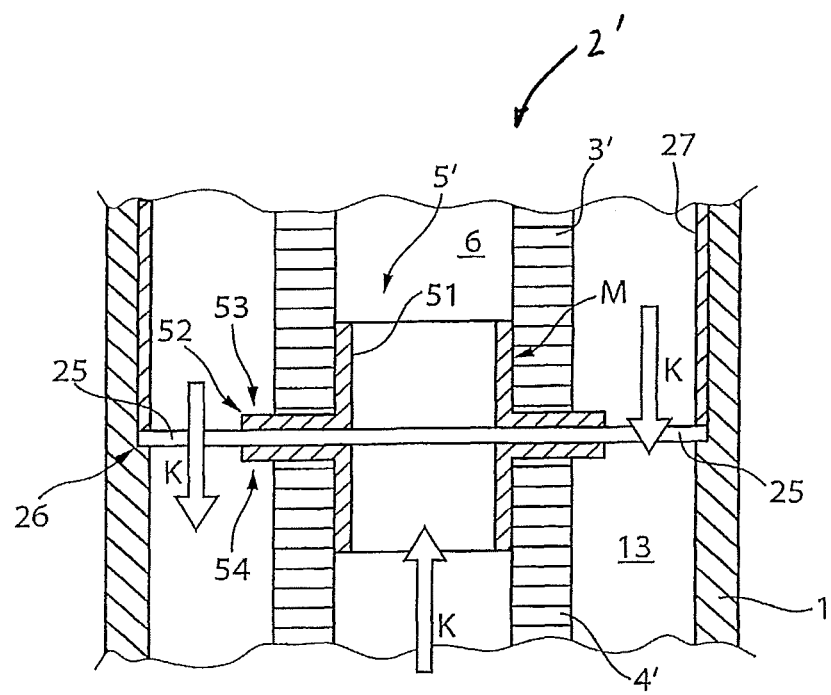
Figure 2B:
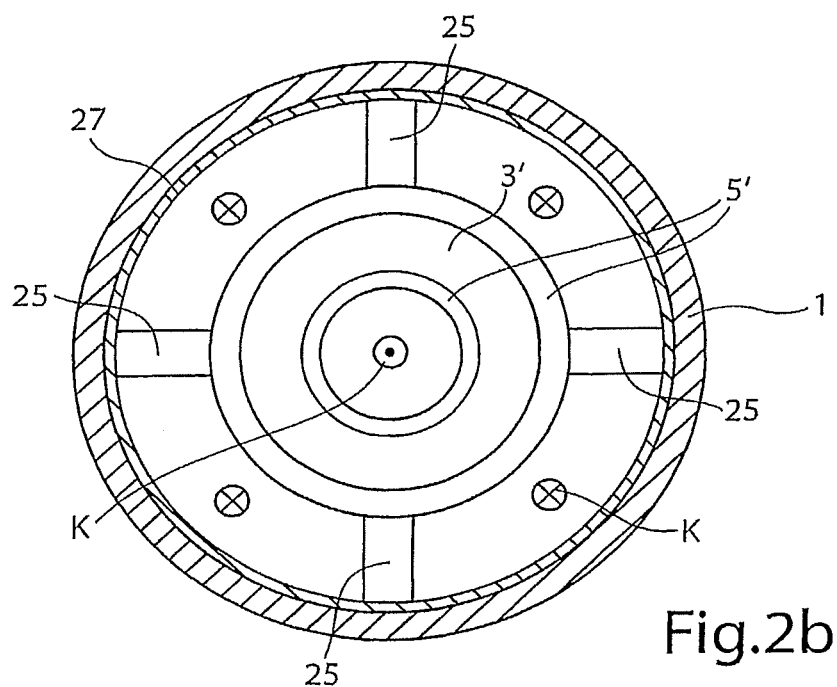

A preferred embodiment for constructing such a connector 5' is shown in longitudinal section in FIG. 2a, and in a cross sectional view through an actuating drive in FIG. 2b. Connecting element 5' is substantially a cylinder or a sleeve base body 51 with an outer sleeve diameter matching the inner diameter of hollow cylindrical actuator elements 3' and 4'. In the example illustrated, the hollow cylindrical actuator 2' has elements 3' and 4' which have the same geometry, so that hollow cylindrical base body 51 has a uniform outer sleeve diameter. Of course, variations of the hollow cylindrical base body 51 are possible in which the outer diameter is adapted individually to match the inner diameters of differently dimensioned, hollow cylindrical actuator elements 3' and 4'.

For axial support of the end faces of the two hollow cylindrical actuator elements 3' and 4', connection element 5' has a sleeve collar 52 which surrounds the hollow cylindrical base body. The collar 52 has two support surfaces 53 and 54 aligned orthogonally with outer surface M of hollow cylindrical base body 51 which face axially away from each other, on which the front faces of hollow cylindrical actuator elements 3' and 4' are supported directly. Sleeve collar 52 extends around the entire outer surface M of hollow cylindrical base body 51, so that the end faces of actuator elements 3' and 4' supported over the full area of each end face 53 and 54 thereof.

Hollow cylindrical actuator elements 3' and 4' are preferably joined to connecting element 5' loosely without any adhesive. In this way, any effects of linear expansion along hollow cylindrical actuator elements 3' and 4' are not impeded by a fixed material connection to the outer surface M of connecting element 5'.

The dimensioning and arrangement of connecting element 5' is selected between the respective axially joined hollow cylindrical actuator elements 3' and 4' such that there is little or no effect on coolant flow K. Sleeve collar 52 is located a radial distance from housing 1, so that coolant flow K flows in FIG. 2a from the bottom up along hollow duct 6 and from the top down inside interspace 13 remains unaffected.

For centering the hollow cylindrical actuator elements 3' and 4' inside housing 1, centring elements 25, that are preferably in the form of pin-like or peg-like spring elements, are each a spring hanger clamped on two-sides, which is joined by the radially inwardly oriented end thereof to the connecting element 5' and by the radially outwardly facing end thereof to housing 1. To ensure a defined axial fixing of centring elements 25, a mechanical stop 26 is provided on the inner side of housing 1, and the respective radially outer ends of centring elements 25 bear on the stop. A fixing sleeve 27 is mounted on the inner wall of housing 1 and is used for axial securing and fixing of centring elements 25.

As shown in the cross-sectional view in FIG. 2b, centring elements 25 fix connecting sleeve 5' centrically within housing 1 at four local points, and are able to deform axially when the length of hollow cylindrical actuator elements 3' and 4' changes, ensures that centring elements 25 cannot obstruct the change in length of actuator elements 3' and 4'. Of course, fewer or more than four centring elements 25 may be provided for the purpose of centering connecting sleeve 5" inside the housing, as evenly distributed as possible around the circumference of sleeve connecting piece 5'. In order to avoid hindering the axial position change of actuator elements 3' and 4', it is particularly advantageous to support the radially inward-facing ends of the centring elements 25 so as to be radially slidably disposed in connecting element 5'.

Connecting element 5' may be used to create actuating drives in which the solid body actuators are assembled from two, but particularly three or more individual, hollow cylindrical actuator elements. The connectors secure both the axial joining of two actuator elements, and in particular help avoiding radial tilting or position shifting, especially in solid body actuators, which are assembled from many axially coupled actuator elements 3' and 4' to have a desired total actuator length.

FIG. 3a shows a further embodiment in longitudinal section and a perspective view of a single part for producing a connecting element 5" which, similar to the embodiment of FIGS. 2a and 2b, has a hollow cylindrical base body 51' having an outer diameter matching the inner diameters of the identically shaped hollow cylindrical actuator elements 3" and 4". The hollow cylindrical connecting element 5" also has a sleeve collar 52' completely surrounding the hollow cylindrical base body 51' of connecting element 5" which is in the form of a ring providing two supporting surfaces 53' and 54', on which the end faces of the two actuator elements 3" and 4" are supported.

In addition, sleeve collar 52' comprises a plurality of radially oriented through ducts 28, through which coolant may flow radially outward through the inner hollow duct 6 into the interspace 13 or radially inward in the opposite direction. Housing 1 is shown only partially in outline.

The plurality of through ducts 28 are positioned in an azimuthal uniform distribution inside sleeve collar 52', so that a flow and/or exchange of coolant between hollow duct 6 and interspace 13 may be effected as symmetrically as possible through connecting element 5".

Alternatively, as with the supply and removal of coolant into and out of hollow duct 6 described in connection with the embodiment shown in FIG. 1, it is helpful that the connecting element 5' illustrated in FIG. 3a provides the coolant supply through the radially aligned through ducts 28 inside connecting element 5'. In this way, a division of flow in two axially opposite flow directions inside hollow duct 6 occurs, as is shown by the flow arrows in FIG. 3a. With regard to coolant supply through ducts 28, it is an expedient to provide connecting ducts 28', which for example extend through housing 1 and ensure an external coolant supply, and are in direct or indirect fluid communication with the through ducts. In this way, the plurality of connecting ducts 28' connected with through ducts 28 ensures that connecting element 5" is securely centered inside housing 1.

To ensure the axial flow of coolant into the radially adjacent interspace 13 of the solid body actuator 2' constructed by the coaxial combination of two or more hollow cylindrical actuator elements 3" and 4", it is important to provide flow diversions at the axially opposite (not illustrated in FIG. 3a) ends of solid body actuator 2', through which the respective coolant streams K flow axially inside hollow duct 6 and into the radially outward interspace 13. Diversion of the flow at the two axially opposite ends of solid body actuator 2' causes two coolant flows that converge in the region of connecting element 5', as is indicated by the flow arrows in FIG. 3a. In order to transport the converging subflows K away, it is important to provide at least one outgoing hollow conduit 21 in housing 1, via which the warmed coolant K may be forwarded to a corresponding cooling facility (not illustrated).

FIG. 3b shows another embodiment of a connecting element 5'''. In this case, it is assumed that lower actuating element 4''' is constructed as a solid cylinder with the upper end face abutting directly with a punch shaped connecting element 5'''. The upper actuating element 3''' is a hollow cylinder and has a hollow cylindrical interior, into which precisely fits a hollow cylindrical shaped section 55 of the punch shaped connecting element 5'''. The hollow cavity surrounded by hollow cylindrical shaped section 55 is in fluid communication with a plurality of radially oriented through ducts 28' which open radially into the interspace 13. One possible coolant flow scenario is identified by the coolant flow arrows K in FIG. 3b, wherein coolant is introduced along hollow duct 6, so that the coolant flow after passing through the radially oriented through ducts 28 flows bidirectionally both axially upwardly and downwardly through interspace 13. In this case, it is important to provide corresponding dissipating hollow ducts at the respective axially opposite ends of solid body actuator 2' for dissipating the heated coolant.

FIG. 3c shows an embodiment of a connecting element 5"", which combines at least three hollow cylindrical actuating elements with each other. For example, two hollow cylindrical actuating elements 3A and 3B are arranged coaxially with one inside the other with actuating elements 3A and 3B being dimensioned so that outer hollow cylindrical actuating element 3A surrounds the inner hollow cylindrical actuating element 3B with a radial clearance gap 29. Both actuating elements 3A and 3B are able to increase the overall force to be generated due to their coaxial parallel arrangement. Both hollow cylindrical actuating elements 3A and 3B are supported on a shared support surface 53''' of connecting element 5"". A hollow cylindrical actuating element 4"" abuts lower support surface 54"" with its end face. Just as in FIGS. 2a and b and 3a, connecting element 5"" has a hollow cylindrical base body 51"" with the outer diameter matching the inner diameter of hollow cylindrical actuating elements 3B and 4"".

For cooling actuating elements 3A and 3B and 4"" in FIG. 3c, through ducts are created inside sleeve collar 52"". At least one first through duct 28A provides a fluidic connection between the outer interspace 13 and the radial clearance gap 29. At least one second through duct 28B ensures an exchange of coolant between inner hollow duct 6 and interspace 13.

The flow arrows in FIG. 3c reflect the flow of coolant K established inside hollow duct 6, interspace 13 and radial clearance gap 29.

FIG. 3d shows a further embodiment of the axial combination of two hollow cylindrical actuating elements 3""' and 4""'. The two actuating elements differ significantly with regard to the thickness of their hollow cylinder wall. In the case as shown, the wall is thicker in upper hollow cylindrical actuating element 3""' than in lower actuating element 4""'. In this case, connecting element 5""' between the two actuating elements has no hollow cylindrical base body. Instead, connecting element 5""' is a connecting plug having an outer contour conforming precisely and in a fluid-tight manner with the inside diameters of the respective hollow cylindrical actuating elements 3""' and 4""'. Connecting element 5""' has through ducts 28C and 28D, which are dimensioned and arranged such that first through duct 28C a fluid connection is between hollow duct 6B, which is defined by a lower actuating element 4""', with which interspace 13 is created. The second through duct 28D connects hollow duct section 6A, which is bounded by upper hollow cylindrical actuator element 3""', with the radially outward interspace 13. Both through ducts 28C and 28D open into a uniform axial exit plane which passes through sleeve collar 52""'.

All connecting elements illustrated in FIGS. 1 to 3 ensure the reliable axial combination of each of two hollow cylindrical actuating elements, or as in FIG. 3b, a solid cylindrical actuating element with a hollow cylindrical actuator element. Of course, all of the connecting elements as shown may be used for the axial combination of any number of individual hollow cylindrical actuating elements with each other to create a large and elongated solid body actuator combination.

FIG. 4 illustrates one of many possible ways to produce an actuating drive having more than two coaxially combined, individual hollow cylindrical actuating elements. The actuating drive 1, which is illustrated extremely diagrammatically in FIG. 4, within housing 1, has four hollow cylindrical single actuators 30, 31, 32 and 33 combined axially in series. The total serial arrangement of the actuators forms the solid body actuator having the lower end supported on a mechanically fixed counter bearing 34 on one side of the housing 1, and the upper end of which comprises actuating element 15, that extends through housing 1. FIG. 4 shows in particular that several different serially disposed connecting elements 5", 5' and 5" may be used to construct a solid body actuator 2. Thus, hollow cylindrical actuating elements 30 and 31 as well as 32 and 33 are joined axially by connecting element 5", as is shown in FIG. 3a. The connecting element 5" in question has radially oriented through ducts 28', which in the embodiment of FIG. 4 are connected in fluid-tight manner with housing wall 1 which allows the radial inflow or outflow of a coolant K from the outside to the interior of solid body actuator 2, or in the opposite direction. Connecting ducts 28' of connecting element 5", which connect hollow cylindrical actuating elements 32 and 33 coaxially with each other, are outflow ducts, through which the coolant can drain from inner duct 6 to the outside. There it is forwarded to a cooling device (not shown), from which the coolant K may be returned again through passthrough ducts 28' of the connecting element 5" that connects actuating elements 30 and 31 for feeding into the solid body actuator in the circuit.

In order not to restrict the axial expansion of the solid body, it must be ensured that passthrough ducts 28' are designed to be as flexible as possible, so that solid body actuator 2 is able to expand in the longitudinal direction thereof without obstruction.

For the coaxial connection of hollow cylindrical actuating elements 31 and 32, the connecting element 5' shown in FIGS. 2a and b is used with the radially orientated centring elements 25 enabling centering solid body actuator 2 centrally and coaxially inside housing 1.

Of course, any other combinations of the connecting elements described in the preceding, and particularly with reference to the connecting elements, pictured in FIGS. 3a to d, may be used in the configuration of an actuating drive constructed in accordance with the invention having a solid body actuator with a substantial number of actuator lengths.

LIST OF REFERENCE NUMERALS

1 Housing
2, 2' Solid body actuator
3, 4 Piezoelectric element
3', 3", 3'", 3"" and 3""' Hollow cylindrical actuating element
4', 4", 4"" and 4""'
4'" Solid cylindrical actuating element
5, 5', 5" Sleeve element
51, 51', and 51"" Sleeve body
52 Sleeve collar
53 Support surface
54 Support surface
55 Hollow cylindrical section
6 Hollow duct
6A and 6B Hollow duct sections
7' and 7" First and second frontal face of the solid body actuator
8 Sleeve element
9 Sleeve element
10 Valve block
11 Recess
12 Extension
13 Interspace
14 Stepped recess
15 Actuating element
15' Annular extension
15" Annular shoulder stop surface
15'" Passthrough connection opening
16 Centering element
17 Spring element
18 Mounting plate
19 Fasteners
20 First hollow conduit
21 Second hollow conduit
22 Mounting plate
23 Load cell
24 Mounting plate
25 Centring element
26 Mechanical stop
27 Fixing sleeve
28, 28A, 28B, 28C and 28D Through duct
28' Connecting duct
29 Radial clearance gap
30-33 Hollow cylindrical actuator
34 Mechanical stop
A Exit plane
P Test frame

The invention claimed is:

1. An actuating drive for uniaxial bi-directional deflection of an actuating element comprising:
a solid body actuator with an end located at an end of the solid body actuator having a first frontal face in a housing, the solid body actuator changing in length in a longitudinal direction along a longitudinal axis of an actuating element in response to an electrical voltage applied to the solid body actuator or a magnetic field acting on the solid body actuator, a change in length being transferred via a second frontal face opposite to the first frontal face in the longitudinal direction of displacement of the solid body actuating element, the housing at least partly surrounding the solid body actuator, the solid body actuator together with the housing defining at least one fluid-tight interspace, including a first hollow duct passing through the solid body actuator at least in regions thereof; and wherein
the first hollow duct has a hollow end connected to a first hollow conduit passing through the housing and has another hollow end which opens into an opening into the at least one interspace; and
the at least one interspace is connected in a fluid-tight manner with a second hollow conduit passing through the housing; and wherein
the solid body actuator includes at least one of two hollow cylindrical piezoelectric elements, two hollow magnetostrictive elements and at least two actuator stacks comprising hollow cylindrically shaped piezoelectric or magnetostrictive layers which are joined by end faces thereof;
at least one connecting element joining together longitudinally the piezoelectric elements or the magnetostrictive elements or the at least two actuator stacks; and wherein
each connecting element has an outer wall with an outer diameter matching an inner diameter of the piezoelectric elements, the magnetostrictive elements or the actuator stacks, which are connected to an outer wall of the connecting element and directly abut each other at a respective end face thereof.

2. The actuating drive according to claim 1, wherein:
the solid body actuator comprises a rod including the first hollow duct passing through the solid body actuator in a longitudinal direction with the first hollow duct opening into end faces of the solid body actuator;
the housing and the solid body actuator radially define the interspace surrounding the solid body actuator over an entire length thereof and which is in fluid connection with the first hollow duct in a region of the second frontal face; and
a second hollow conduit opens through the housing into the interspace in a region of the first frontal face of the solid body actuator.

3. An actuating drive according to claim 1, wherein:
the solid body actuator comprises a piezoelectric actuator including at least two hollow cylindrical or perforated disc piezoelectric elements or individual components supplied with an electrical voltage via separate electrical feeds.

4. An actuating drive according to claim 2, wherein:
the solid body actuator comprises a piezoelectric actuator including at least two hollow cylindrical or perforated disc piezoelectric elements or individual components supplied with an electrical voltage via separate electrical feeds.

5. An actuating drive according to either of claim 1, wherein:
the solid body actuator comprises a magnetostrictive actuator including at least the two magnetostrictive elements in a hollow cylinder or a perforated disc element or individual magnetostrictive components which generate a variable magnetic field interacting with the magnetostrictive actuator.

6. An actuating drive according to either of claim 2, wherein:
the solid body actuator comprises a magnetostrictive actuator including at least the two magnetostrictive elements in a hollow cylinder or a perforated disc element or individual magnetostrictive components which generate a variable magnetic field interacting with the magnetostrictive actuator.

7. An actuating drive according to claim 1, including:
a centring device for centering the solid body actuator with respect to the housing disposed at a region of an end face of the solid body actuator, the centring device being in operative connection with the solid body actuator and the actuating element to axially bias the solid body actuator in combination with a force provided by a spring element.

8. An actuating drive according to claim 2, including:
a centring device for centering the solid body actuator with respect to the housing disposed at a region of an end face of the solid body actuator, the centring device being in operative connection with the solid body actuator and the actuating element to axially bias the solid body actuator in combination with a force provided by a spring element.

9. An actuating drive according to claim 3, including:
a centring device for centering the solid body actuator with respect to the housing at a region of an end face of the solid body actuator with the centring device being in operative connection with the solid body actuator and the actuating element to axially bias the solid body actuator in combination with a force provided by a spring element.

10. An actuating drive according to claim 5, including:
a centring device for centering the solid body actuator with respect to the housing at a region of an end face of the solid body actuator with the centring device being in operative connection with the solid body actuator and the actuating element to axially bias the solid body actuator in combination with a force provided by a spring element.

11. An actuating drive according to claim 1, comprising:
a fluid pump for delivering a liquid or gas-phase coolant from a coolant reservoir to the interspace and to the first hollow conduit.

12. An actuating drive for uniaxial bi-directional deflection of an actuating element comprising:
a solid body actuator with an end located at an end of the solid body actuator having a first frontal face in a housing, the solid body actuator changing in length in a longitudinal direction along the longitudinal axis of an actuating element in response to an electrical voltage applied to the solid body actuator or a magnetic field acting on the solid body actuator, a change in length being transferred via a second frontal face opposite to the first frontal face in the longitudinal direction of displacement of the solid body actuating element, the housing at least partly surrounding the solid body actuator, the solid body actuator together with the housing defining at least one fluid-tight interspace, including a first hollow duct passing through the solid body actuator at least in regions thereof; and wherein
the first hollow duct has a hollow end connected to a first hollow conduit passing through the housing and has another hollow end which opens into an opening into the at least one interspace; and
the at least one interspace is connected in a fluid-tight manner with a second hollow conduit passing through the housing; and wherein
the solid body actuator includes at least one of two hollow cylindrical piezoelectric elements, at least two hollow magnetostrictive elements and at least two actuator stacks comprising hollow cylindrically shaped piezoelectric or magnetostrictive layers which are joined by end faces thereof;
at least one connecting element joining together the piezoelectric elements or the magnetostrictive elements or the actuator stacks; and wherein
each connecting element has an outer diameter matching an inner diameter of the piezoelectric elements, the magnetostrictive elements or the actuator stacks, has collar projecting radially outward beyond the connecting element in a circumferential direction and has an outer surface including two support surfaces each aligned orthogonally with the outer surface and facing axially away from each other and on which frontal faces of the hollow cylindrical piezoelectric elements, the magnetostrictive elements or the actuator stacks are at least partially supported.

13. The actuating drive according to claim 12, wherein:
the solid body actuator comprises a rod including the first hollow duct passing through the solid body actuator in a longitudinal direction with the first hollow duct opening into end faces of the solid body actuator;
the housing and the solid body actuator radially define the interspace surrounding the solid body actuator over an entire length thereof and which is in fluid connection with the first hollow duct in a region of the second frontal face; and
a second hollow conduit opens through the housing into the interspace in a region of the first frontal face of the solid body actuator.

14. An actuating drive according to claim 12, wherein:
the solid body actuator comprises a piezoelectric actuator including at least two hollow cylindrical or perforated disc piezoelectric elements or individual components supplied with an electrical voltage via separate electrical feeds.

15. An actuating drive according to claim 12, wherein:
the solid body actuator comprises a piezoelectric actuator including at least two hollow cylindrical or perforated disc piezoelectric elements or individual components supplied with an electrical voltage via separate electrical feeds.

16. An actuating drive according to either of claim 13, wherein:
the solid body actuator comprises a magnetostrictive actuator including at least the two magnetostrictive elements in a hollow cylinder or a perforated disc element or individual magnetostrictive components which generate a variable magnetic field interacting with the magnetostrictive actuator.

17. An actuating drive according to either of claim 12, wherein:
the solid body actuator comprises a magnetostrictive actuator including at least the two magnetostrictive elements in a hollow cylinder or a perforated disc element or individual magnetostrictive components which generate a variable magnetic field interacting with the magnetostrictive actuator.

18. An actuating drive according to claim 13, including:
a centring device for centering the solid body actuator with respect to the housing disposed at a region of an end face of the solid body actuator, the centring device being in operative connection with the solid body actuator and the actuating element to axially bias the solid body actuator in combination with a force provided by a spring element.

19. An actuating drive according to claim 12, comprising:
a fluid pump for delivering a liquid or gas-phase coolant from a coolant reservoir to the interspace and to the first hollow conduit.

* * * * *